United States Patent [19]

Dorman

[11] Patent Number: 4,719,409

[45] Date of Patent: Jan. 12, 1988

[54] DIGITAL SIGNAL OUTPUT CAPACITANCE SENSOR DISPLACEMENT GAUGING SYSTEM

[75] Inventor: Richard A. Dorman, Troy, N.Y.

[73] Assignee: Mechanical Technology Incorporated, Latham, N.Y.

[21] Appl. No.: 782,887

[22] Filed: Oct. 2, 1985

[51] Int. Cl.⁴ ............... G01H 11/00; G01R 27/02
[52] U.S. Cl. ................... 324/60 CD; 340/870.37; 73/1 DV
[58] Field of Search ............... 331/111, 143; 340/870.37; 73/1 DV; 324/60 C, 60 CD, 60 R, 61 R

[56] References Cited

U.S. PATENT DOCUMENTS

| | | | |
|---|---|---|---|
| 3,325,727 | 6/1967 | Haas | 324/60 R |
| 4,103,225 | 7/1978 | Stephens | 324/60 CD |
| 4,176,555 | 12/1979 | Dorman | 73/1 DV |
| 4,295,091 | 10/1981 | Ponkala | 324/60 CD |
| 4,404,481 | 9/1983 | Ide | 324/60 CD |

FOREIGN PATENT DOCUMENTS

| | | | |
|---|---|---|---|
| 0161506 | 10/1982 | Japan | 340/870.37 |
| 2072856 | 10/1981 | United Kingdom | 340/870.37 |

Primary Examiner—Reinhard J. Eisenzopf
Assistant Examiner—Jose M. Solis
Attorney, Agent, or Firm—Joseph V. Claeys; Joseph C. Sullivan

[57] ABSTRACT

A new variable impedance type system is described for measuring a preselected physical parameter such as spacing, displacement, pressure, vibration, etc. A sensor/transducer is positioned to provide the variable impedance. The sensor/transducer is part of a self-oscillatory circuit which produces pulses having a pulse rate proportional to the physical parameter being measured.

2 Claims, 3 Drawing Figures

DIGITAL SIGNAL OUTPUT CAPACITANCE SENSOR DISPLACEMENT GAUGING SYSTEM

BACKGROUND OF THE INVENTION

1. Field of Invention

This invention relates to a new and improved signal system for use with measuring sensor/transducers of the variable impedance type.

More particularly, the invention relates to a signal amplifier system for improved processing of the voltage signal developed by a sensor/transducer used to measure certain physical parameters such as displacement, force, torsion, temperature, size, pressure, vibration and the like. The physical parameter to be measured causes a variation in the impedance of one of the elements of the sensor transducer which in turn is used to vary the pulse rate of the signals generated by the system. The pulse rate is indicative of the physical parameter being measured.

2. Description of the Prior Art

Many types of physical parameters such as displacement, size, pressure, force, tension, vibration and the like may be determined by measuring the spacing between two elements, at least one of which shifts with respect to the other in accordance with the parameter of interest. If the two elements are, or can be made metallic then they can be treated as forming a variable impedance with a capacitance indicative of the spacing between the elements. Thus the spacing may be determined by measuring the impedance (or capacitance) of the elements.

However, because of certain fringe effects and other stray capacitance between any two elements, it was difficult to devise a variable impedance type measuring system in which a linear output could be obtained. One such system is disclosed in commonly assigned U.S. Pat. No. 4,067,225 entitled CAPACITANCE TYPE NON-CONTACT DISPLACEMENT AND VIBRATION MEASURING DEVICE AND METHOD OF MAINTAINING CALIBRATION, granted on Jan. 10, 1978 to Richard A. Dorman et al. An amplifier system using the variable impedance sensor/transducer of said U.S. Pat. No., 4,067,225 to generate an A.C. signal indicative of a physical parameter of interest by modulating the output of a carrier oscillator is disclosed in a commonly assigned U.S. Pat. No. 4,176,555 entitled SIGNAL AMPLIFIER SYSTEM FOR CONTROLLED CARRIER SIGNAL MEASURING SENSOR/TRANSDUCER OF THE VARIABLE IMPEDANCE TYPE, granted on Dec. 4, 1979 to Richard A. Dorman.

Frequently, it is necessary or desirable to use the measurements obtained from a sensor/transducer in an automatic signal processing or monitoring system. It was found that if this latter signal processing or monitoring system is adapted to handle digital signals then auxiliary interfacing systems must be provided for analog-to-digital conversion and conditioning of the AC signals generated by the device described in the above-mentioned U.S. Pat. No. 4,176,555. It is well known that such auxiliary systems invariably delay the signals and therefore reduce the overall response time of the monitoring system. In addition, analog-to-digital data conversion is accompanied by quantization and other types of errors which degrade the overall resolution and accuracy of the system.

OBJECTIVES AND SUMMARY OF THE INVENTION

In view of the problems described above, it is a primary objective of the present invention to provide a capacitance sensor/transducer gauging system which produces signals indicative of displacement which are compatible with a digital signal processor without the need for conversion or interfacing means.

A further objective is to provide a capacitive gauging system which provides square pulses having a pulse rate indicative of the spacing between two elements.

Another objective is to provide a capacitive gauging system which is self-oscillatory so that external oscillators are unnecessary.

According to this invention, a capacitive element having a variable impedance indicative of a physical parameter of interest, such as displacement, vibration, spacing, size, pressure and the like, is placed in a self-oscillatory loop having an oscillating frequency dependent on said variable impedance. Preferably, the variable impedance is placed in series with a reference impedance, an excitation voltage is applied to the impedances and an output signal is derived from the voltage across the variable impedance. Preferably, the voltage across the variable impedance is used to vary the excitation voltage in a feedback loop to insure that the output signal varies linearly with said variable impedance. The voltage across the variable impedance is also constantly monitored and when said voltage reaches a reference level, the polarity of the excitation voltage is reversed. Since the voltage change across the sensor/transducer depends on its impedance, pulses are produced at a rate proportional to the impedance of the sensor/transducer.

DETAILED DESCRIPTION OF A PREFERRED EMBODIMENT OF THE INVENTION

Figure 1:
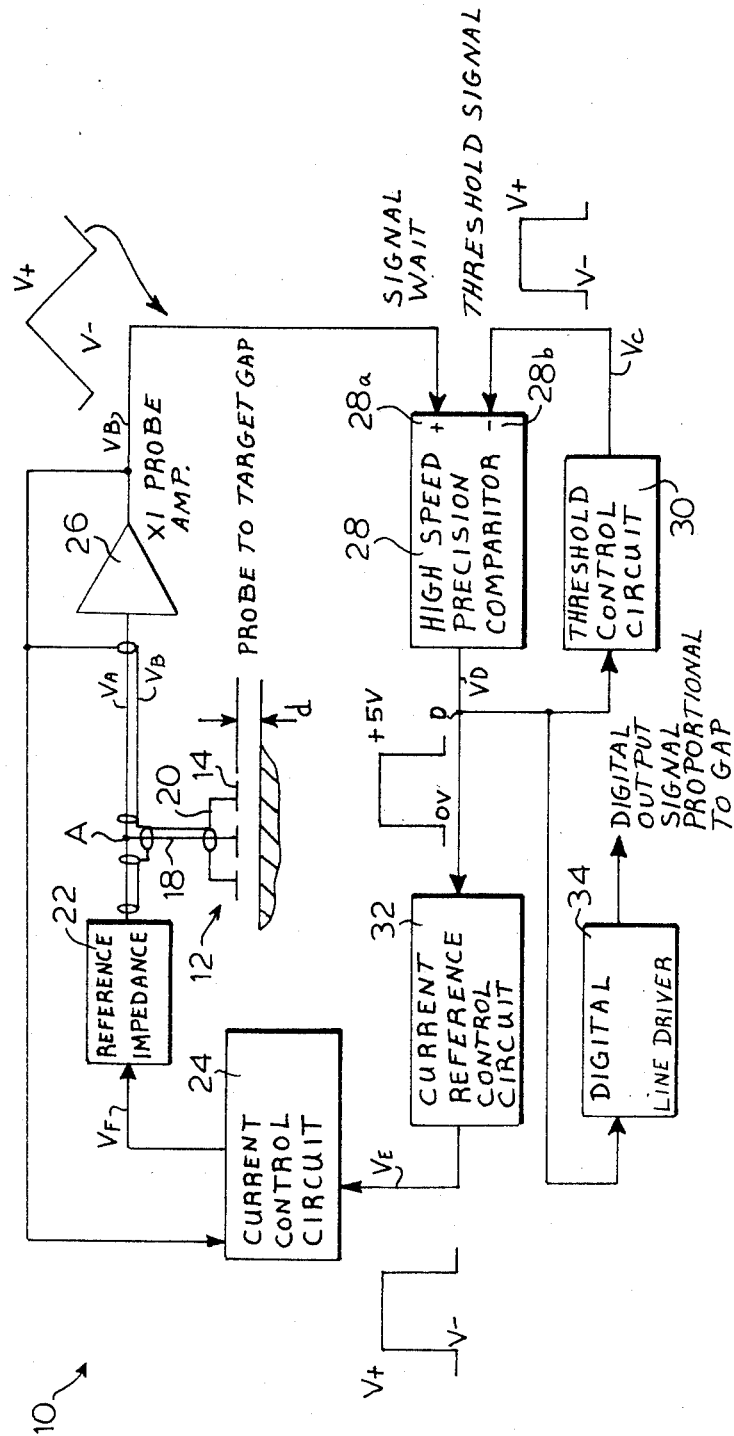
FIG. 1 shows a functional block diagram of a preferred embodiment of the present invention.

Referring now to the figures, and more particularly, to FIG. 1, a system 10 is shown which comprises a variable impedance sensor/transducer 12 for determining a preselected physical parameter. For example, the sensor/transducer may be a capacitive transducer such as the one described in the above identified U.S. Pat. No. 4,067,225 in which a probe 14 is positioned for measuring the displacement d between the probe and a work piece 16. The probe comprises a central element 18 surrounded and concentrically shielded by an annular element 20 provided to eliminate stray capacitance. It should be understood that for the purposes of the present invention any other type of variable impedance sensor/transducers would be just as effective. The probe is connected in series with a reference impedance 22 to a source of excitation signal 24 which, as shall be described in more detail below, may comprise a current control circuit. The voltage across the sensor/transducer 12, $V_A$ is fed to a unity gain amplifier 26. The purpose of amplifier 26 is to isolate and decouple the sensor/transducer voltage $V_A$ from the remaining portion of the system. Preferably amplifier 26 is a high input impedance amplifier, and a very low input capacitance. For example, amplifier 26 may have the following characteristics:

| | |
|---|---|
| Open Loop gain | 200 at 500 KHz |
| Input Capacitance | 0.005 pf |
| Common Mode Rejection | 60 db in the range from 5 KHz to 500 KHz |
| Closed Loop Bandwidth | 5 MHz |
| Slew Rate of Output Signal | 50 V/Microsec. |
| Maximum Output Current | 10 mA |
| Input Voltage Range | ±5 volt d.c. |
| Output Impedance | 1 ohm at 500 KHz. |

The output of amplifier 26, $V_B$ is used as a feedback signal to the excitation signal source 24. More particularly, it is desirable to obtain a triangular waveshape for $V_A$, $V_B$. Normally, if the excitation signal to the reference impedance 22 and variable impedance 12 is constant, $V_A$ (and therefore $V_B$) would start off as a linear curve but would fairly soon deteriorate into a standard charging exponential curve. However in the present invention the excitation signal is forced to rise at approximately the same rate as $V_A$ to insure that $V_A$ remains linear. This is particularly advantageous in the present situation where the exponential time constant for $V_A$ is not fixed but dependent on the impedance of sensor/transducer 12. Voltage $V_B$ is also applied to outer shielding 20 to reduce stray capacitance as mentioned above.

The output of amplifier 26, $V_B$ is also fed to one of the input ports (such as the non-inverting port 28a) of a very high precision voltage comparator 28. The other input port (i.e. the inverting port 28b) of the comparator 28 receives a reference voltage $V_C$ from a threshold control circuit 30. The comparator 28 has an output $V_D$ which is determined by whether one or the other of input ports senses a higher voltage. Thus for example, as long as the voltage at port 28b is higher than the voltage at 28a, output voltage $V_D$ has a low value, such as 0 $V_{DC}$. As soon as the voltage at port 28a exceeds the voltage at port 28b the output voltage $V_D$ jumps to a high value, such as +5 $V_{DC}$.

Figure 3:
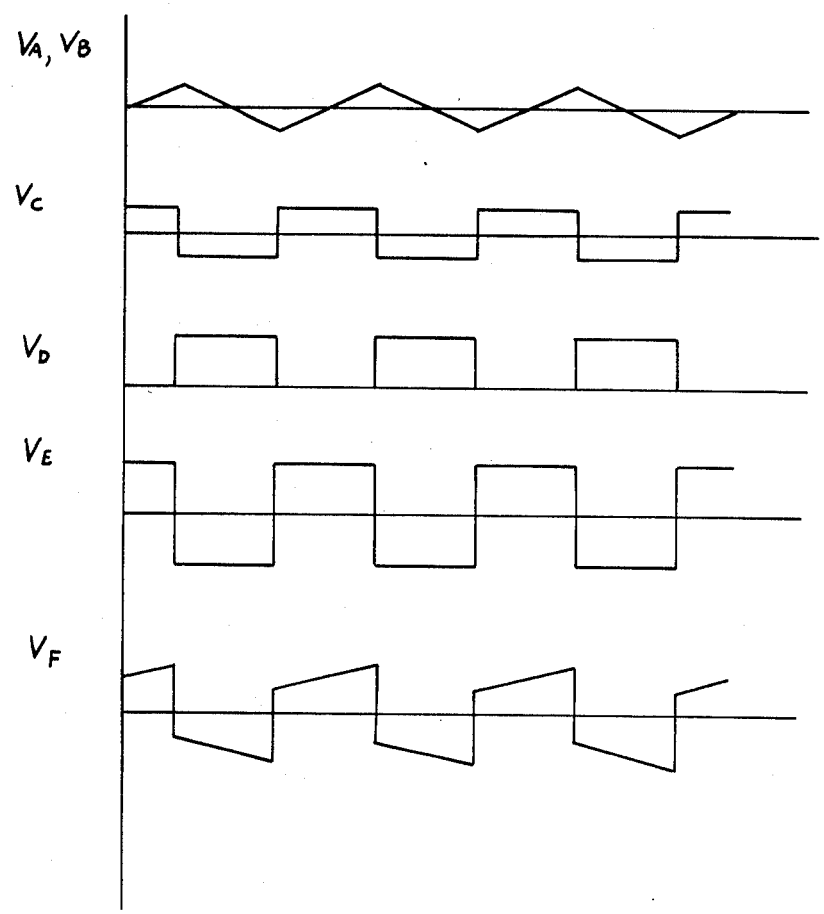
FIG. 3 shows the signals generated at various points of the diagram of FIG. 1.

The voltages at various nodes of the system of FIG. 1 are shown in FIG. 3, as a function of time. As can be seen in FIG. 3, initially, $V_F$, the excitation voltage from source 24, may be positive causing $V_A$ and $V_B$ to rise linearly. During this initial period, the reference voltage $V_C$ from the threshold control circuit 30 is also high, and therefore $V_D$ is low.

As soon as $V_B$ reaches the high value of reference voltage $V_C$ the comparator output voltage $V_D$ jumps to its high value as shown. The output voltage $V_D$ is fed to a current reference control circuit 32 which is used to derive a reference control voltage $V_E$ for the current control circuit 24. Thus, initially, for a positive excitation voltage $V_F$, $V_E$ may have a positive value V+. As soon as $V_D$ goes high, the current reference control circuit switches its output $V_E$ to a negative level V−. In response, the source 24 also reverses voltage $V_F$ as shown in FIG. 3, thereby reversing the current flow to the reference and variable impedances. In response, voltage $V_A$ starts sloping downward as shown in FIG. 3.

Voltage $V_D$ from comparator 28 is also fed to the threshold control circuit 30 which in response generates reference voltage $V_C$. Voltage $V_C$ is high for a low $V_D$ voltage and low for a high $V_D$ voltage. Therefore, as soon as $V_D$ goes high, $V_C$ is flipped to a low (negative) value as shown in FIG. 3. Thus even though $V_B$ has a negative slope, after $V_D$ goes high, the input to port 28a is still higher than $V_C$ at port 28b. Therefore, $V_B$ continues sloping downward until it reaches the low level of $V_C$. At this point, the comparator 28 flips its output again and the whole process described above repeats itself.

It is obvious from the above description, that the system shown in FIG. 1 is self-oscillatory, with a frequency of oscillation being directly and precisely proportional to the impedance of sensor/transducer 12. The system generates a triangular wave ($V_A$, $V_B$) and a rectangular or square wave ($V_D$). The voltage pulses $V_D$ are fed to a digital line driver 34 to produce a string of binary digital output pulses, having a pulse rate proportional to the output of sensor/transducer 12. Obviously, the output pulse stream from the line driver 34 may be used in a number of ways by a digital monitoring system. For example, it may be fed to a pulse counter which is operated for a preselected time period.

Figure 2:
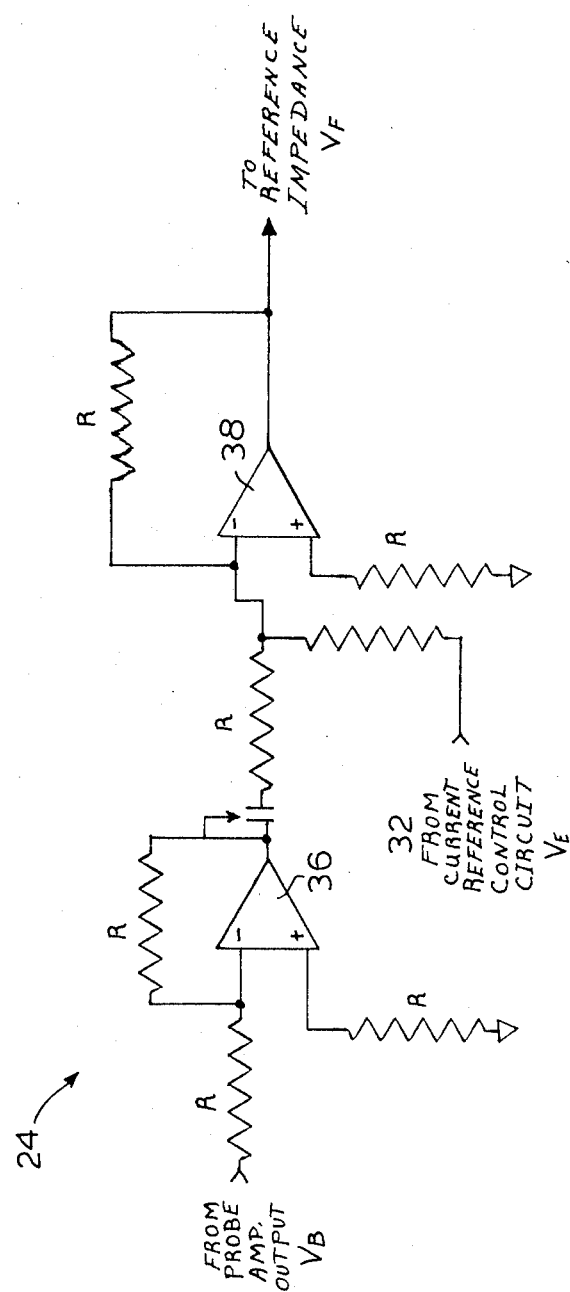
FIG. 2 shows details of the current control circuit of the diagram of FIG. 1.

The excitation source or current control circuit 24 may be implemented in a number of ways. For example, as shown in FIG. 2, the circuit 24 may comprise two operational amplifiers 36, 38. The first amplifier 36 has its inverting input coupled to the output of probe amplifier 26. The purpose of this amplifier is to insure that the excitation signal tracks the sensor/transducer voltage as described above to insure a linear wave-form. The output of amplifier 36 and the control reference voltage $V_E$ are then summed by summing amplifier 38 to generate the excitation voltage $V_F$ as described above. The signal $V_E$ determines the polarity of the excitation signal.

A preferred embodiment of the invention was described herein in conjunction with a sensor/transducer measuring spacing or displacement between two elements. However, it is obvious to one skilled in the art that the principles described herein are equally applicable to any other type of sensor/transducer with a variable impedance.

From the foregoing description it will be appreciated that the invention provides a new and improved system using a variable impedance sensor/transducer and which is capable of producing signals indicative of a physical parameter of interest and compatible with digital signal monitoring or processing systems. In this system digital signals are produced without expensive, power consuming and error prone analog-to-digital interfacing circuits. In fact the total number of elements in this system is less than in the comparable analog-signal producing system described in the above-mentioned U.S. Pat. No. 4,176,555.

Having described a preferred embodiment of a new and improved system for producing digital signals from a measuring sensor/transducer of the variable impedance type, constructed in accordance with the invention, it is believed obvious that numerous modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A system for producing signals compatible with digital circuits indicative of a physical parameter comprising:

a sensor/transducer having an impedance which varies in accordance with said physical parameter;

a reference impedance connected in series with an output of said sensor transducer;

a current control circuit having an output providing an excitation signal which is connected in series to said reference impedance;

means for amplifying an output signal from said sensor/transducer and for conveying a signal through a feedback path to said current control circuit;

a comparator having an input from said amplifying means and another input which is a reference voltage;

a threshold control circuit having an input from an output of said comparator and providing an output constituting said reference voltage to said another input of said comparator; and a current reference control circuit having an input connected to an output of said comparator and an output connected to an input of said current control circuit;

said system functioning such that an ouput voltage from said amplifying means equaling or exceeding said reference voltage causes said output of said comparator to switch to the higher of one of two possible voltage output states and causes said output of said current reference control circuit to switch to the lower of one of two possible output voltage states, said switching causing said output of said current control circuit to switch polarities which in turn causes a reversal to current flow in said sensor/transducer and reference impedance, said switching also causing said threshold control circuit ouput to switch to the lower of one of two possible voltage states, and simultaneously with said switching said amplifying means output voltage begins to decline until it reaches a level below that of said threshold control circuit output at which time said switching reverses whereby said system operates in a cyclical manner and is thus self-oscillatory and wherein said current control circuit comprises a first operational amplifier having said input connected to said feedback path from said amplifying means and a second operational amplifier which has an input which combines and output signal from said first operational amplifier with said current reference control circuit output, and said output of said current control circuit connected to said reference impedance.

2. The system of claim 1 further comprising a digital line driver connected to said comparator output for generating an output pulse stream, the pulse rate of said stream being proportional to said sensor/transducer impedance.

* * * * *